United States Patent
Meiser (10) Patent No.: US 9,985,126 B2
(45) Date of Patent: May 29, 2018

(54) SEMICONDUCTOR DEVICE COMPRISING A FIRST GATE ELECTRODE AND A SECOND GATE ELECTRODE

(71) Applicant: Infineon Technologies AG, Neubiberg (DE)

(72) Inventor: Andreas Meiser, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/060,790

(22) Filed: Mar. 4, 2016

(65) Prior Publication Data
US 2017/0256641 A1    Sep. 7, 2017

(51) Int. Cl.
*H01L 29/78* (2006.01)
*H01L 29/40* (2006.01)
*H01L 29/10* (2006.01)

(52) U.S. Cl.
CPC ...... *H01L 29/7813* (2013.01); *H01L 29/1095* (2013.01); *H01L 29/407* (2013.01); *H01L 29/7831* (2013.01)

(58) Field of Classification Search
CPC ............ H01L 29/7813; H01L 29/1095; H01L 29/407; H01L 29/7831
USPC ......................................... 257/331; 438/156
See application file for complete search history.

(56) References Cited

U.S. PATENT DOCUMENTS

| | | | |
|---|---|---|---|
| 6,359,498 B1 | 3/2002 | Kurihara et al. | |
| 2005/0146940 A1* | 7/2005 | Hofmann | G11C 16/0491 365/185.26 |
| 2006/0125044 A1* | 6/2006 | Haller | H01L 27/0218 257/506 |
| 2008/0017845 A1* | 1/2008 | Drndic | B82B 3/00 257/24 |
| 2009/0073111 A1 | 3/2009 | Miyazaki | |
| 2014/0015592 A1 | 1/2014 | Weis | |
| 2014/0151798 A1 | 6/2014 | Meiser et al. | |
| 2015/0137224 A1* | 5/2015 | Meiser | H01L 29/4175 257/331 |

FOREIGN PATENT DOCUMENTS

JP        52036483 A    3/1977

* cited by examiner

*Primary Examiner* — Bo Fan
(74) *Attorney, Agent, or Firm* — Murphy, Bilak & Homiller, PLLC (57) ABSTRACT

A semiconductor device includes a transistor. The transistor includes a source region and a drain region disposed adjacent to a first main surface of a semiconductor substrate, a first gate electrode and a second gate electrode, the first gate electrode being disconnected from the second gate electrode. The transistor further includes a body region. The first gate electrode is adjacent to a first portion of the body region and the second gate electrode is adjacent to a second portion of the body region. The transistor further includes first trenches patterning the first portion of the body region into a first ridge, and second trenches patterning the second portion of the body region into a second ridge. The first gate electrode is arranged in at least one of first trenches, and the second gate electrode is arranged in at least one of the second trenches.

20 Claims, 11 Drawing Sheets

SEMICONDUCTOR DEVICE COMPRISING A FIRST GATE ELECTRODE AND A SECOND GATE ELECTRODE

BACKGROUND

Power transistors commonly employed in automotive and industrial electronics should have a low on-state resistance ($R_{on} \cdot A$), while securing a high voltage blocking capability. For example, a MOS ("metal oxide semiconductor") power transistor should be capable, depending upon application requirements, to block drain to source voltages $V_{ds}$ of some tens to some hundreds of thousands volts. MOS power transistors typically conduct very large currents which may be up to some hundreds of Amperes at typical gate-source voltages of about 2 to 20 V.

Further developments are being made to develop new transistor concepts.

SUMMARY

According to an embodiment, a semiconductor device comprises a transistor. The transistor comprises a source region and a drain region disposed adjacent to a first main surface of a semiconductor substrate, a first gate electrode and a second gate electrode, the first gate electrode being disconnected from the second gate electrode, and a body region. The first gate electrode is adjacent to a first portion of the body region and the second gate electrode is adjacent to a second portion of the body region. The transistor further comprises first trenches, the first trenches patterning the first portion of the body region into a first ridge, and second trenches, the second trenches patterning the second portion of the body region into a second ridge. The first gate electrode is arranged in at least one of the first trenches, and the second gate electrode is arranged in at least one of the second trenches.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, insulated gate field effect transistors (IGFETs) such as metal oxide semiconductor field effect transistors (MOSFETs) may be n-channel or p-channel MOSFETs. For example, in an n-channel MOSFET, the source and the drain region are doped with n-type dopants. In a p-channel MOSFET, the source and the drain region are doped with p-type dopants. As is to be clearly understood, within the context of the present specification, the doping types may be reversed. If a specific current path is described using directional language, this description is to be merely understood to indicate the path and not the polarity of the current flow, i.e. whether the current flows from source to drain or vice versa. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

The Figures and the description illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

Figure 1A:
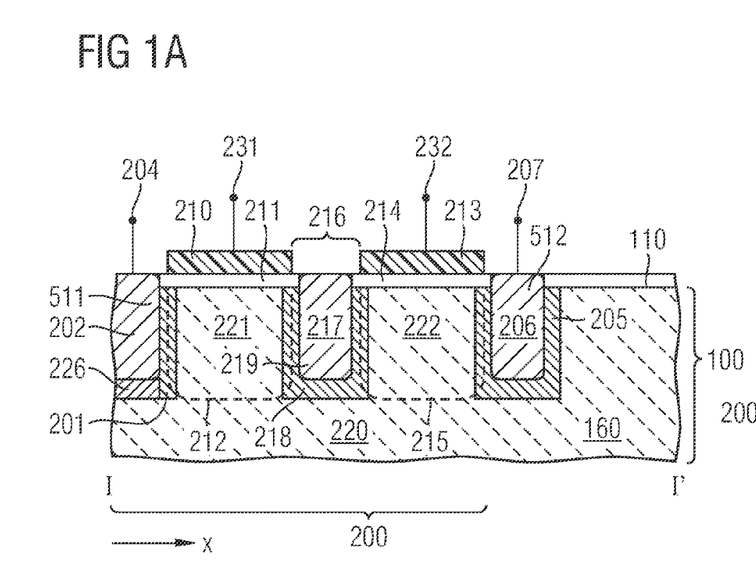
FIGS. 1A to 1D show cross-sectional views of a semiconductor device according to an embodiment.
Figure 1B:
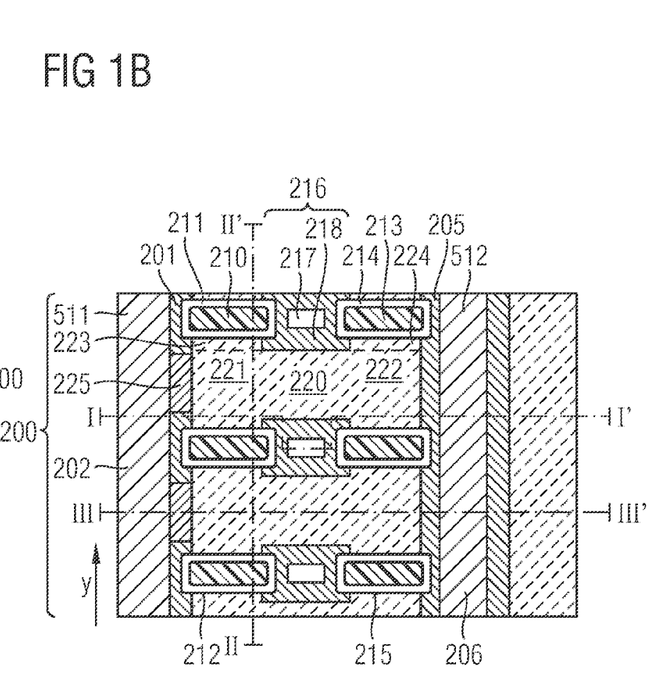

The terms "wafer", "substrate", "semiconductor substrate" or "semiconductor body" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material FIG. 1A shows a vertical cross-sectional view of a semiconductor device according to an embodiment. The cross-sectional view is taken between I and I', as is also indicated in FIG. 1B, wherein at region 216 the cross-sectional view is shifted in the y-direction. The semiconductor device 1 shown in FIG. 1A comprises a transistor 200. The transistor 200 comprises a source region 201 and a drain region 205 which are disposed adjacent to a first main surface 110 of a semiconductor substrate 100. The transistor further comprises a first gate electrode 210 and a second gate electrode 213. The first gate electrode 210 is disconnected from the second gate electrode 213, i.e. the first gate electrode and the second gate electrode are separated from each other and are not connected to a common terminal. The transistor 200 further comprises a body region 220. The first gate electrode 210 is disposed adjacent to a first portion 221 of the body region 220 and the second gate electrode 213 is adjacent to a second portion 222 of the body region 220.

The transistor further comprises first trenches 212, the first trenches patterning the first portion 221 of the body region 220 into a first ridge. The transistor further comprises second trenches 215, the second trenches 215 patterning the second portion 222 of the body region 220 into a second ridge. The first gate electrode 210 is arranged in at least one of the first trenches 212 and the second gate electrode 213 is arranged in at least one of the second trenches 215. The first and the second trenches 212, 215 are indicated by broken lines in FIG. 1A. In more detail, they are disposed before and behind the depicted plane of the drawing. As will be explained in more detail with reference to FIG. 1C, the first trenches 212 and the second trenches 215 pattern the first portion 221 of the body region into first ridges and pattern the second portions 222 of the body region 220 into second ridges.

Throughout the present specification elements of field effect transistors are described. Generally, a field effect transistor comprises a plurality of transistor cells that are connected in parallel. For example, as will be discussed in the present specification, each single transistor cell comprises a first gate electrode, a second gate electrode, a body region and further components. The first gate electrodes of the single transistor cells may be connected to a common terminal, e.g. a first gate terminal. The second gate electrodes of the single transistor cells may be connected to a common terminal, e.g. a second gate terminal. Further components of the single transistor cells, e.g. source regions, drain regions may be respectively connected to a common source terminal, a common drain terminal etc. The following description specifically describes the structure of the single transistor cells while generally referring to a transistor. However, as is to be clearly understood the single transistor cells are connected with a plurality of further transistor cells so as to form the respective transistor. Some of the components of the transistor cells such as the body regions may be formed separately from each other. Other components of the transistor cells such as the drain regions may be formed jointly for all of the transistor cells connected in parallel.

The source region 201 and the drain region 205 may be of the first conductivity type, e.g. n-type, and the body region 220 may be of the second conductivity type, e.g. p-type.

The source region 201 is disposed adjacent to a first main surface 110 of the semiconductor substrate 100. For example, the source region 201 may extend into the semiconductor substrate 100, for example to a bottom side of the first trench 212. The source region 201 may be electrically connected to a source terminal 204 via a source contact 202. According to an embodiment, the source contact 202 may be electrically connected to the first portion 221 of the body region 220 and to the body region 220 by means of a horizontal body contact portion 226. The horizontal body contact portion 226 may be disposed at a bottom side of the source contact 202. For example, the source contact 202 may be disposed in a source contact groove 511 that may be arranged in the first main surface 110 of the semiconductor substrate 100. The source contact groove 511 may be filled with a conductive material to form the source contact 202. A sidewall of the source contact groove 511 may be doped with dopants e.g. of the first conductivity type, to form the source region 201. As will be described below with reference to FIGS. 1B and 1D, further portions of the sidewall of the source contact groove 511 may be doped with dopants of the second conductivity type to form the vertical body contact portions 225.

The bottom side of the source contact groove 511 may be doped with dopants, e.g. of the second conductivity type, to form the horizontal body contact portion 226. The drain region 205 may extend into the semiconductor substrate 100. For example, the drain region may be disposed at a sidewall of a drain contact groove 512 which is filled with a conductive material to form a drain contact 206. The drain region 205 is electrically connected via the drain contact 206 to a drain terminal 207. According to the embodiment shown in FIG. 1A, the drain groove 512 in which the drain region 205 and the drain contact 206 are defined, may be disposed within the body region 220.

The source region 201 and the drain region 205 are disposed along a first direction, e.g. the x-direction parallel to a horizontal surface of the semiconductor substrate 100. The first and second trenches 212, 215 may have a longitudinal axis that extends in the first direction.

The semiconductor device may further comprise a connection portion 216 that electrically connects the first portion 221 of the body region with the second portion 222 of the body region. For example, as is illustrated in FIG. 1A, the connection portion may be implemented by a connection groove 219 having sidewalls which are doped with dopants of the first conductivity type to form the doped region 218 and may be filled with a conductive filling 217. According to further embodiments, the inner portion of the connection portion 216 may be omitted. In other words, the first portion 221 of the body region and the second portion 222 of the body region may be disposed at a very small distance. For example, only a doped portion 218 may be disposed between the first portion 221 of the body region and the second portion 222 of the body region. According to further embodiments, the connection region 216 may be implemented by a narrow connection groove 219 filled with an insulating material. Further, the connection region 216 may be implemented by a thin insulating layer portion, e.g. a gate dielectric layer. When the distance between the first portion 221 of the body region and the second portion 222 of the body region is reduced, the area needed for the transistor and, consequently, $R_{on} \cdot A$ is further reduced. The connection groove 219 may. e.g. extend to a depth of the source contact groove 511 or the drain contact groove 512. As a result, the first portion 221 of the body region and the second portion 222 of the body region are electrically connected along the depth direction of the semiconductor substrate. As a result, the resistance between first portion 221 and second portion 222 is decreased and, hence, $R_{on} \cdot A$ of the transistor is further reduced.

The first gate electrode 210 may be insulated from the first portion 221 of the body region by means of a first gate dielectric layer 211. Further, the second gate electrode 213 may be electrically insulated from the second portion 222 of the body region by means of a second gate dielectric layer 214. The first gate electrode 210 may be connected to a first gate terminal 231, and the second gate electrode 213 may be electrically connected to a second gate terminal 232. For example, the first gate electrode 210 may be driven at a frequency which is different from a frequency which drives the second gate electrode 213. For example, the second gate electrode 213 may be driven at a comparatively low frequency, whereas the first gate electrode 210 may be driven by a high frequency signal. According to an interpretation, the second gate electrode 213 and the adjacent second portion 222 of the body region may be understood to implement a drift region which is controlled by a second gate electrode 213.

FIG. 1B shows a horizontal cross-sectional view of the semiconductor device. As can be readily recognized, the first gate electrode and the second gate electrode of each of the single transistors are arranged along the first direction e.g. the x direction. The connection portion 216 is disposed between the first gate electrode 210 and the second gate electrode 213. The connection portion 216 which may be implemented by a doped portion is disposed between adjacent gate electrodes. The body region 220 extends along the first direction between adjacent transistor cells.

The source contact 202 may be disposed in a source contact groove 511 and the drain region 205 is disposed in a drain contact groove 512. A longitudinal axis of the source contact groove 511 may extend in a second direction, e.g. the y-direction. A longitudinal axis of the drain contact groove 512 may extend in the second direction. The drain region 205 is disposed at a sidewall of the drain contact groove 512. A first portion of the sidewall of the source contact groove 511 is doped with dopants of the first conductivity type to form the source region 201. Further, a second portion of the sidewall of the source contact groove 511 is doped with a second conductivity type so as to form the vertical body contact portion 225.

When the transistor is switched on, e.g. by applying a suitable voltage to the first gate electrode 210, a first conductive inversion layer 223 (conductive channel) is formed at the boundary between the first portion 221 of the body region and the gate dielectric layer 211. Accordingly, the field effect transistor is in a conducting state from the source region 201 to the connection portion 216. Further, when a second suitable voltage is applied to the second gate electrode 213, a second conductive inversion layer 224 is formed at the boundary between the second portion 222 of the body region and the second gate dielectric layer 214. Accordingly, the second part of the field effect transistor is in a conducting state from the connection portion 216 to the drain region 205. As a result, the transistor, which may also be referred to as a dual-gate transistor is in a conducting state from the source region 201 to the drain region 205. The first channel 223 and the second channel 224 are electrically connected by means of the connection portion 216.

In case of switching off, no conductive inversion layer is formed at at least one of the first gate electrode 210 and the second gate electrode 213. As a result, the dual-gate transistor is in a non-conducting state.

Figure 1C:
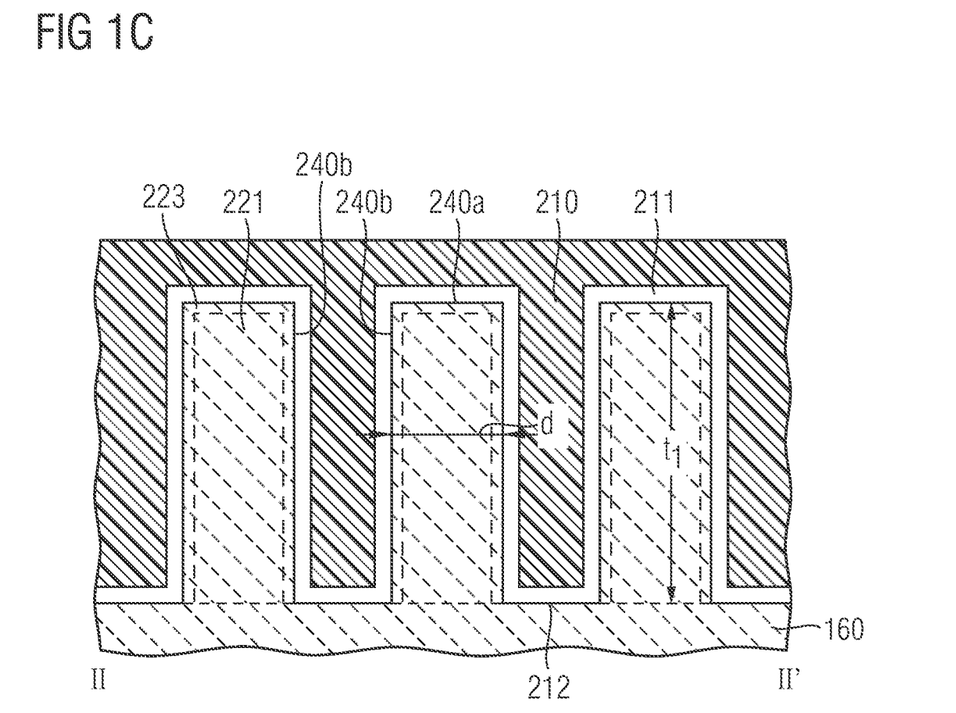

FIG. 1C shows a cross-sectional view which is taken along the second direction. The cross-sectional view of FIG. 1C is taken between II and II', as is illustrated in FIG. 1B so as to intersect a plurality of first gate trenches 212. The first portions 221 of the body region are patterned by adjacent first gate trenches 212 into single ridges or fins. The ridges comprise a top surface 240a and sidewalls 240b. A first gate dielectric layer 211 is disposed adjacent to the sidewalls 240b and the top surface 240a of each of the ridges. The conductive material is filled in the trenches 212 between adjacent ridges to form the first gate electrode 210. As a result, the first portion 221 of the body region has the shape of a ridge extending in the first direction. Differently stated, a longitudinal axis of the ridges of the fins extends in the first direction perpendicularly to the plane of the drawing. The sidewalls 240b may extend perpendicularly or at an angle of more than 75° with respect to the first main surface 110. The first gate electrode 210 may be disposed adjacent to at least two sides of the ridge. When a suitable voltage is applied to the first gate electrode 210 a first conductive channel 223 is formed at the boundary between the first portion of the body region 221 and the first gate dielectric layer 211. For example, a distance between adjacent first gate trenches 212 that corresponds to a width d of the ridges may be larger than 200 nm, e.g. 200 to 2000 nm, for example, 400 to 600 nm. The first gate trenches 212 may extend to a depth t1 into the semiconductor substrate. The depth t1 may correspond to the depth of the second gate trenches 215. The depth t1 may further correspond to the depth of the source region 201 or the drain region 205.

According to a further embodiment, the width d1 of the body region 220 fulfils the following relationship: $d1 \leq 2 \cdot l_d$, wherein $l_d$ denotes a length of a depletion zone which is formed at the interface between the gate dielectric layer 211 and the body region 220. For example, the width of the depletion zone may be determined as:

$$l_d = \sqrt{\frac{4\varepsilon_s kT \ln(N_A/n_i)}{q^2 N_A}}$$

wherein $\varepsilon_s$ denotes the permittivity of the semiconductor material ($11.9 \times \varepsilon_0$ for silicon, $\varepsilon_0 = 8.85 \times 10^{-14}$ F/cm), k denotes the Boltzmann constant ($1.38066 \times 10^{-23}$ J/k), T denotes the temperature (e.g. 300 K), ln the denotes the natural logarithm, $N_A$ denotes the impurity concentration of the semiconductor body, $n_i$ denotes the intrinsic carrier concentration ($1.45 \times 10^{10}$ cm$^{-3}$ for silicon at 27° C.), and q denotes the elementary charge ($1.6 \times 10^{-19}$ C).

Generally, the length of the depletion zone varies depending from the gate voltage. It is assumed that in a transistor the length of the depletion zone at a gate voltage corresponding to the threshold voltage corresponds to the maximum width of the depletion zone. For example, according to the embodiment, the width of the first ridges may be approximately 10 to 200 nm, for example, 20 to 60 nm along the main surface 110 of the semiconductor substrate 100.

According to the embodiment in which the width d1≤2*ld, the transistor is a so-called "fully-depleted" transistor in which the body region 220 is fully depleted when the gate electrode 210 is set to an on-voltage. In such a transistor, an optimal sub-threshold voltage may be achieved and short channel effects may be efficiently suppressed, resulting in improved device characteristics.

As has been discussed above, the source region 201 vertically extends into the semiconductor substrate 100, and the drain region 205 vertically extends in the semiconductor substrate 100. Further, due to the fact that the first and the second gate electrodes are arranged in gate trenches, the effective channel width of the transistor may be largely increased, thereby reducing the on-state resistance.

Figure 1D:
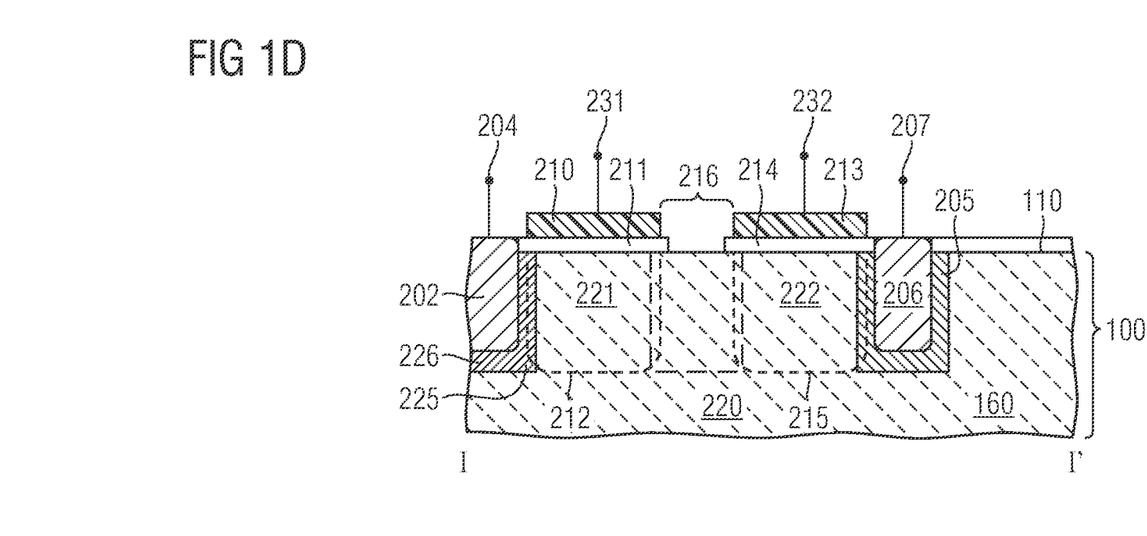

FIG. 1D shows a cross-sectional view of the semiconductor device between III and III' as is indicated in FIG. 1B. Differing from the cross-sectional view shown in FIG. 1A, this cross-sectional view is taken so as to intersect the vertical body contact portion 225. As is illustrated, the vertical body contact portion 225 is disposed between the source contact 202 and the first portion 221 of the body region 220. According to the embodiment, the vertical body contact portion 225 may vertically extend along at least a portion of the source contact groove 511. To be more specific, the vertical body contact portion 225 is formed in the semiconductor body 200 and extends along a sidewall portion of the source contact groove 511 in the depth direction. Moreover, the source region 201 may vertically extend along the source contact groove 511. In more detail, the source region 201 extends along a further sidewall portion of the source contact groove 511 in the depth direction. As a result, the vertical body contact portion 225 and the source region 201 vertically overlap. The term "vertically overlap" is intended to mean that portions of the vertical body contact portion 225 and of the source region 201 are disposed at the same height, i.e. a position along the depth direction (z-direction) of the semiconductor substrate 100. According to the embodiment shown in FIGS. 1A to 1D, the source region and a vertical body contact portion of adjacent transistor cells may be alternatingly disposed at a sidewall of the source contact groove 511.

According to this embodiment, due to the feature that the vertical body contact portion 225 vertically overlaps with the source region 201, and additionally the feature that the vertical body contact portion 225 is electrically connected to the source contact, the suppression of the parasitic bipolar transistor may be improved. In more detail, holes may be efficiently removed from the body region, thereby preventing detrimental effects such as a snap-back effect. This results in an improved safe-operating area (SOA) that corresponds to a region in the I-V-characteristic in which the semiconductor device may be safely operated. In the depicted cross-sectional view, the body region 220 extends from the source region 201 or the vertical body contact portion 225 to the drain region 205. As a result, also the second portion 222 of the body region 201 is in electrical contact with the vertical body contact portion 225 to enhance the functionality of the vertical body contact portion. Since further the connection portion 216 (not shown in this cross-sectional view) may comprise a connection groove 219 that may extend into the semiconductor substrate 100, this electrical contact may be achieved over the whole depth or width of the transistor. Due to the presence of the horizontal body contact portion 226, the save-operating area (SOA) of the transistor may be further improved.

Figure 2A:
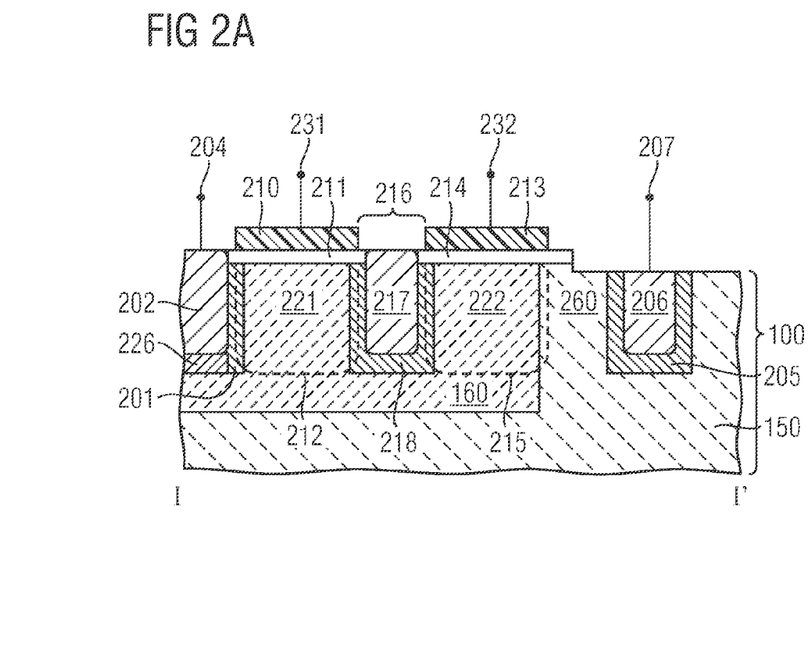
FIGS. 2A to 2D show cross-sectional views of a semiconductor device according to a further embodiment.
Figure 2B:
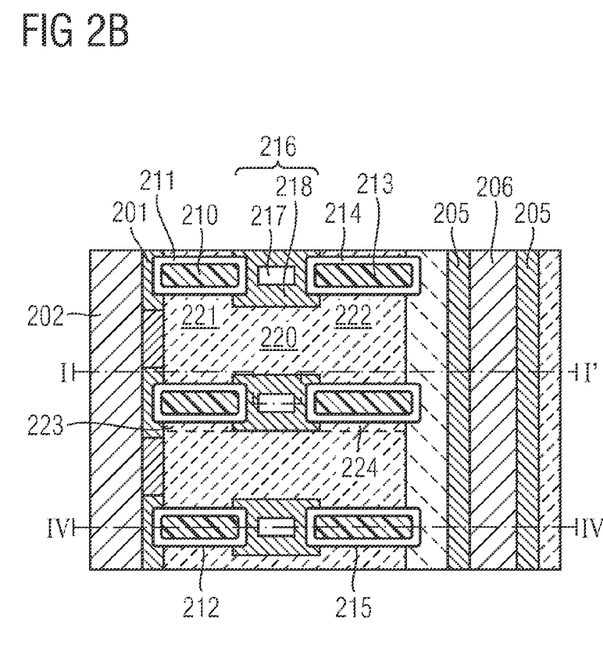

FIGS. 2A and 2B show a vertical and a horizontal cross-sectional view of a semiconductor device according to a further embodiment. Differing from the embodiment illustrated with reference to FIGS. 1A and 1B, the transistor further comprises a drift zone 260 disposed between the second portion 222 of the body region 220 and the drain region 205. For example, the drift zone 260 may be of the first conductivity type, e.g. at a lower doping concentration than the source region 201 or the drain region 205. Due to the presence of the drift zone 260 even at high voltages between source region and drain region a breakdown may be prevented.

FIG. 2B shows a horizontal cross-sectional view. As is shown, the drift zone 260 is disposed as a region extending along the second direction, e.g. the y direction. The drift zone 260 is disposed between the body region 220 and the drain region 205.

Figure 2C:
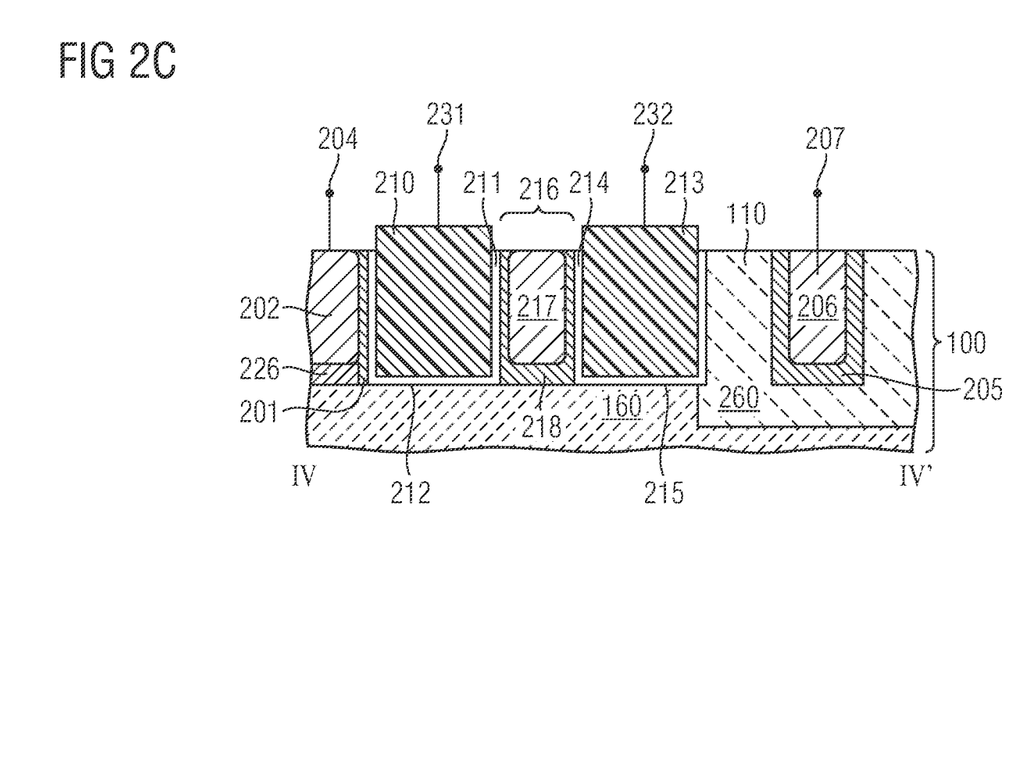
Figure 2D:
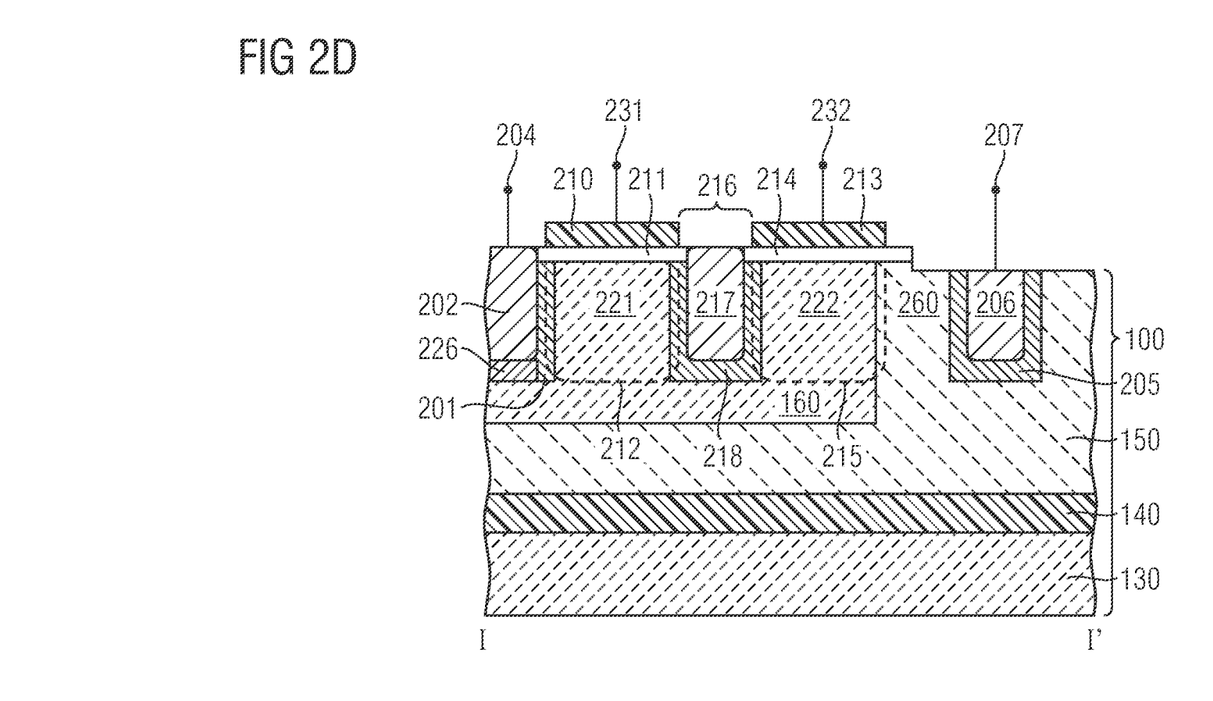

FIG. 2C shows a vertical cross-sectional view of the semiconductor device shown in FIGS. 2A and 2B that is taken between IV and IV', as is also indicated in FIG. 2B. The cross-sectional view of FIG. 2C is taken so as to intersect the gate trenches. As is shown, the trenches 212 and 215 are filled with a conductive material to form the first gate electrode 210 and the second gate electrode 213. FIG. 2D shows a vertical cross-sectional view of the semiconductor device shown in FIGS. 2A and 2B that is taken between I and I', as is also indicated in FIG. 2B.

The substrate may comprise various doped layers in accordance with the requirements of the semiconductor substrate.

Figure 3A:
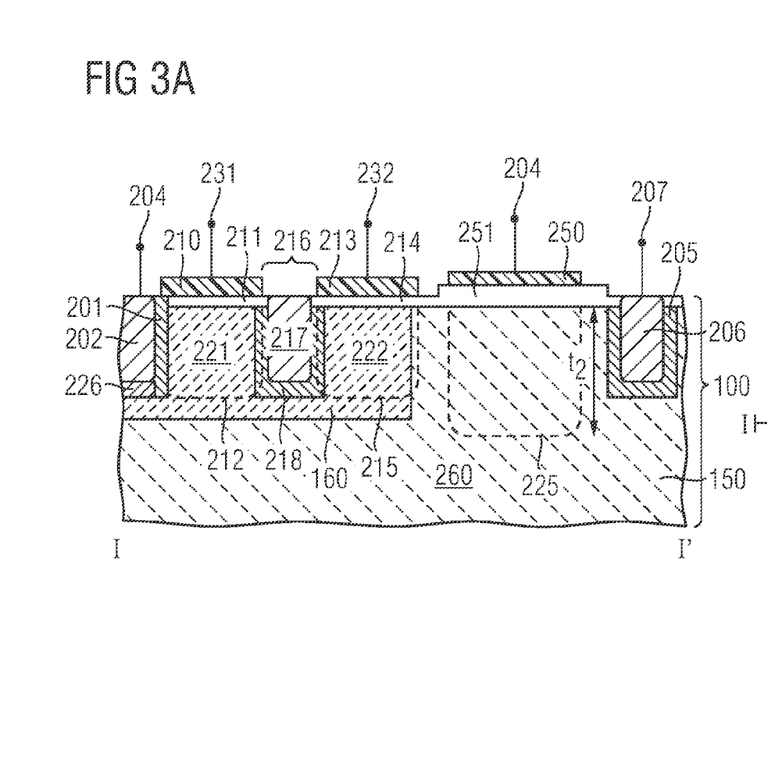
FIGS. 3A to 3D show cross-sectional view of a semiconductor device according to further embodiments.
Figure 3B:
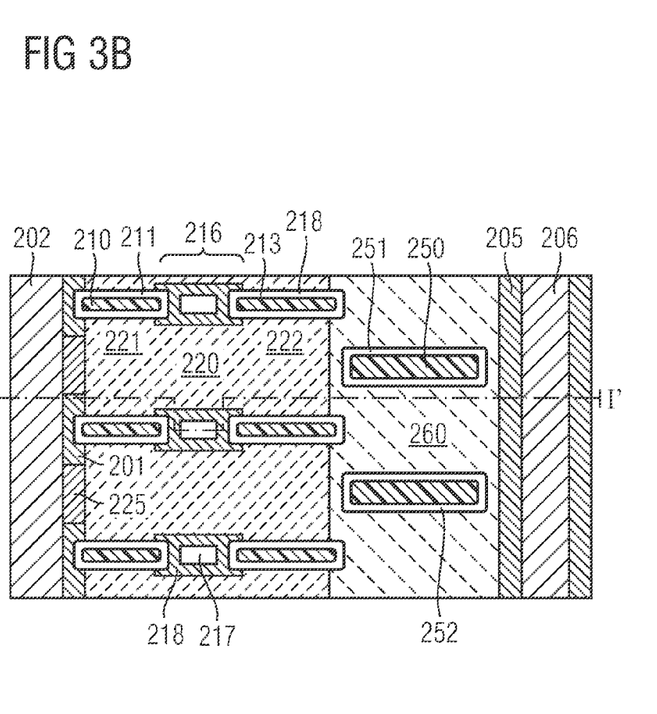
Figure 3C:
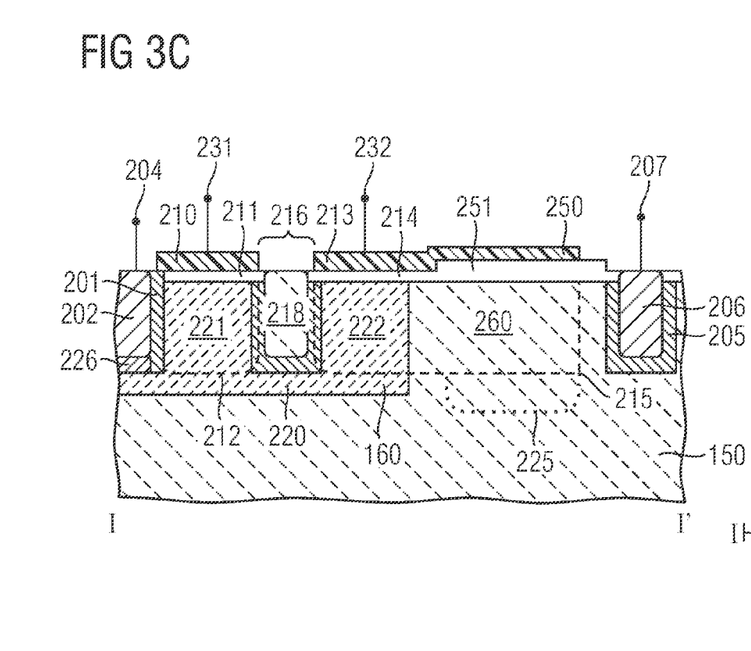
Figure 3D:
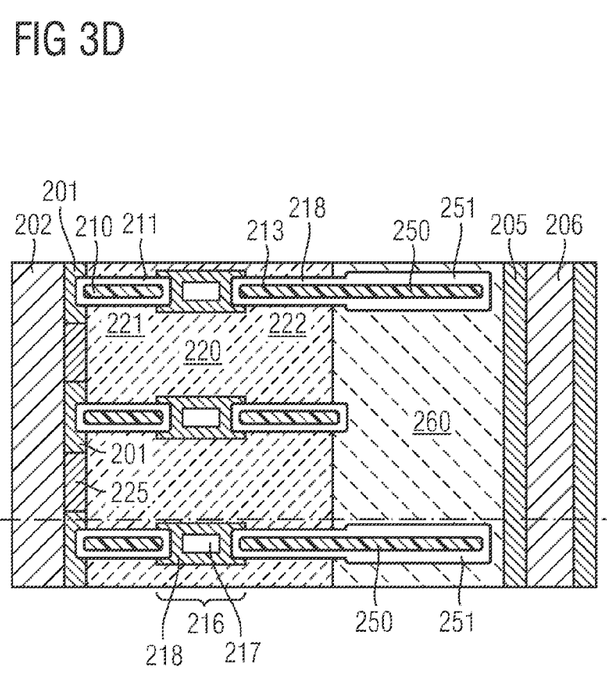

According to the embodiment illustrated in FIG. 3D, the semiconductor substrate 100 may comprise a base layer 130 which may be of the second conductivity type, e.g. p-type. A second semiconductor layer 150 of the first conductivity type, e.g. n-type may be formed over the base layer 130. A buried layer 140 of the first conductivity type which is doped at a higher doping concentration than the second semiconductor layer 150 may be disposed between the base layer 130 and the second semiconductor layer 150. A doped layer 160 which may e.g. be of the second conductivity type is formed over the second semiconductor layer 150. The buried layer 140 provides an electrical insulation of the components of the transistor 200 from the base layer 130. The body region 220 may be defined by the doped layer 160.

According to a further embodiment, the substrate may have a succession of layers that is different from that illustrated in FIG. 2D. For example, the semiconductor substrate 100 may comprise a base layer 130 of the second conductivity type. A layer of the first conductivity type forming the drift zone 260 may be disposed over the base layer 130. A well portion 160 of the second conductivity type may be defined within the layer of the first conductivity type forming the drift zone 260.

According to any embodiments, the doping concentration in the various semiconductor layers may have a gradient. For example, the doping concentration may vary at different portions depending on the requirements of the semiconductor device.

FIGS. 3A and 3B show a further embodiment. Differing from the embodiment illustrated in FIGS. 2A and 2B, the semiconductor device according to the embodiment shown in FIGS. 3A and 3B comprises a field plate 250 which may be disposed adjacent to the drift zone 260. The field plate 250 may be insulated from the drift zone 260 by means of a field dielectric layer 251. The field plate 250 may be connected to a suitable terminal. For example, as is illustrated in FIG. 3A, the field plate 250 may be electrically connected to the source terminal 204. When the transistor is switched off, the field plate may deplete charge carriers from the drift zone so that the breakdown voltage characteristics of the semiconductor device are improved. In a semiconductor device comprising a field plate, the doping concentration of the drift zone may be increased without deteriorating the breakdown voltage characteristics in comparison to a device without a field plate. For example, the doping concentration may be increased in a portion adjacent to the field plate. Further, a region below this portion may be doped at a lower doping concentration in order to provide the desired breakdown voltage characteristics. Due to the higher doping concentration of the drift zone, the on-resistance $R_{on} \cdot A$ is further decreased resulting in improved device characteristics.

The field plate 250 may be implemented as a planar field plate which is disposed entirely over the semiconductor substrate 100. According to a further embodiment, the field plate 250 may be disposed in field plate trenches 252 that pattern the drift zone 260 into a third ridge. For example, as is shown in FIG. 3A, the field plate trenches 252 may be disposed before and behind the depicted plane of the drawing. For example, the field plate trenches 252 may extend to a deeper depth than the first and second gate trenches 212, 215. For example, the field plate trench 252 may extend to a depth t2 which is deeper than the depth t1 illustrated in FIG. 1C. Further, as is shown in FIG. 3A, the depth t2 may larger than the depth t1 of the gate trenches. For example, etching the gate trenches 212, 215 may be performed simultaneously with etching the field plate trenches 252. Due to the larger width of the field plate trenches 252 the field plate trenches may be etched to a larger depth. For example, a bottom side of the field plate trench 252 may be below the bottom side of the body region 220.

FIG. 3B shows a horizontal cross-sectional view of the semiconductor device. As is shown, field plate trenches 252 are disposed in the drift zone 260. For example, field plate trenches 252 may have larger width measured along the second direction than the gate trenches 212, 215. Further, a distance between adjacent field plate trenches 252 may be larger than a distance between adjacent first gate trenches 212 or adjacent second gate trenches 215.

FIGS. 3C and 3D show a vertical and a horizontal cross-sectional view of a semiconductor device according to a further embodiment, respectively. Differing from the embodiment shown in FIGS. 3A and 3B, according to the embodiment shown in FIGS. 3C and 3D, the field plate 250 may be disposed in some or all of the second trenches 215 in which the second gate electrode 213 is disposed. For example, some of all of the second gate trenches 215 may be formed so as to extend to the drift zone 260. The field plate 251 is disposed in the second gate trench 215 and is electrically connected with the second gate electrode 213. The second gate electrode 213 and the field plate 251 may be connected to a second gate terminal 232. The depth of the second gate trench 215 may be constant or may vary along the first direction. For example, in the drift zone 260 the second gate trench 215 may extend to a deeper depth than the second gate trench adjacent to the first portion 222 of the body region, as is indicated by dotted lines.

FIG. 3D shows a horizontal cross-sectional view. As is shown, some of the second gate trenches 215 are extended to the drift zone 260 so that the field plate 250 is disposed in the second gate trenches 215. Moreover, some of the second gate trenches 215 are not extended so that no field plate 250 is disposed in some of the second gate trenches 215. According to the embodiment of FIG. 3D, the field plate may be disposed in every second of the second gate trenches 215.

Figure 4A:
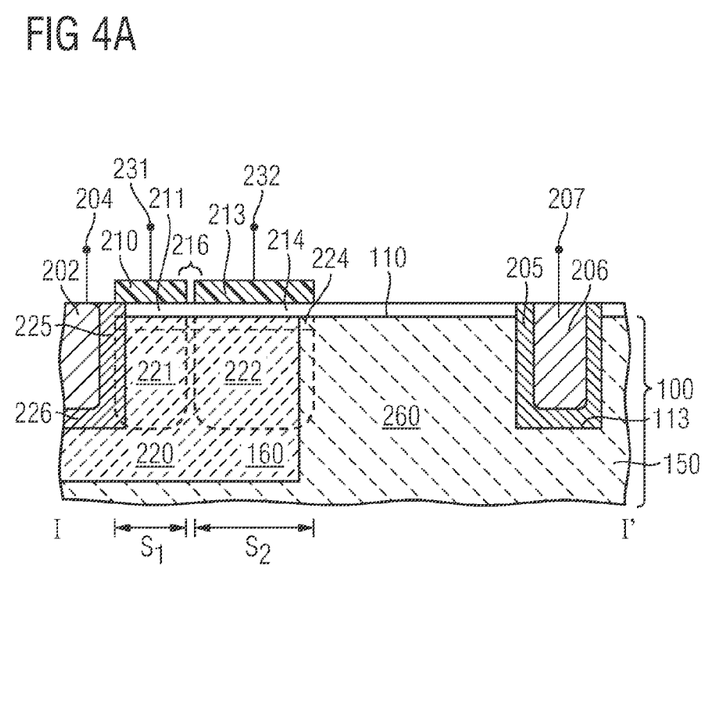
FIGS. 4A and 4B show cross-sectional views of a semiconductor device according to a further embodiment.
Figure 4B:
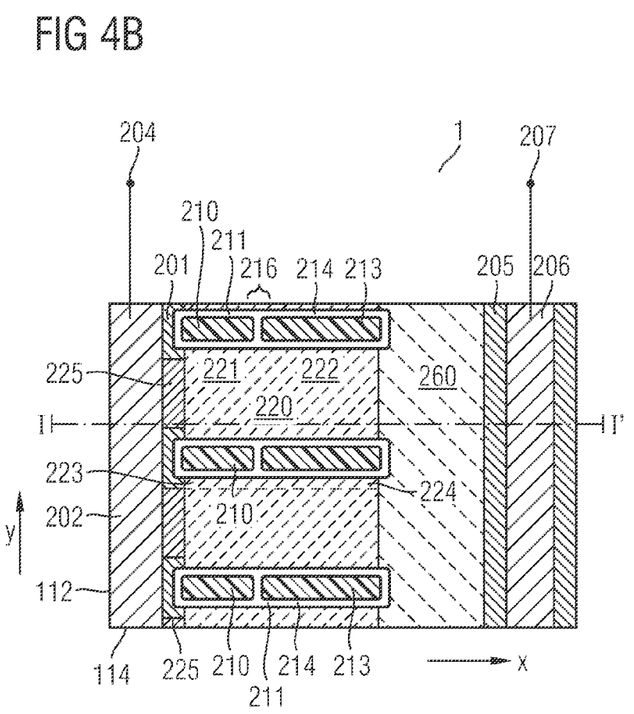

FIGS. 4A and 4B show cross-sectional views of a semiconductor device according to still a further embodiment. Differing from the embodiment illustrated in FIGS. 2A and 2B, for example, the first gate electrode 210 and the second gate electrode 213 are disposed at a very small distance and are electrically insulated by means of a portion of an insulating layer such as the gate dielectric layer.

FIG. 4A shows a vertical cross-sectional view of the semiconductor device according to the embodiment. As is shown, the first portion 221 of the body region adjacent to the first gate electrode 210 is disposed very close to the second portion 222 of the body region which is adjacent to the second gate electrode 213. As a result, as will also be explained with reference to FIG. 4B, the conductive channel 223 formed adjacent to the first gate dielectric layer 211 and the second conductive channel 224 formed at the interface to the second gate dielectric layer 214 are electrostatically connected so that a conductive path exists along the whole extension length of the first gate electrode 210 and the second gate electrode 213. Accordingly, the connection portion is implemented due to the overlapping between the first channel region 223 and the second channel region 224. This arrangement of the first gate electrode 210 and the second gate electrode 213 may be applied to all of the embodiments.

Moreover, independent from the specific arrangement of first and second gate electrode and the implementation of the connection portion 216, the length of the first gate trench 212 may be different from the length of the second gate trench 215. For example, the first length S1 and the second gate length S2 may be measured along the first direction. For example, in case of the presence of a drift zone 260, the configuration comprising the second gate electrode 213 implements a so-called "high voltage transistor" which is adapted to withstand higher voltages than the transistor comprising the first gate electrode 210. For example, the length S2 of the second gate electrode 213 of the high voltage transistor may be larger than the length of the gate electrode S1 of the low-voltage transistor. For example, the lengths S1 and S2 of the first and the second gate electrode 211, 213 may be set so that the desired device characteristics are achieved and, at the same time, the sum of the lengths S1 and S2 is decreased so as to obtain a minimum value of Rdson.

FIG. 4B shows a horizontal cross-sectional view of the semiconductor device according to this embodiment. As is shown, the first and the second gate electrodes 210, 213 may be insulated from each other by means of an insulating material such as a gate dielectric layer. The length S2 of the second gate electrode 213 may be larger than the length S1 of the first gate electrode 210.

Figure 5A:
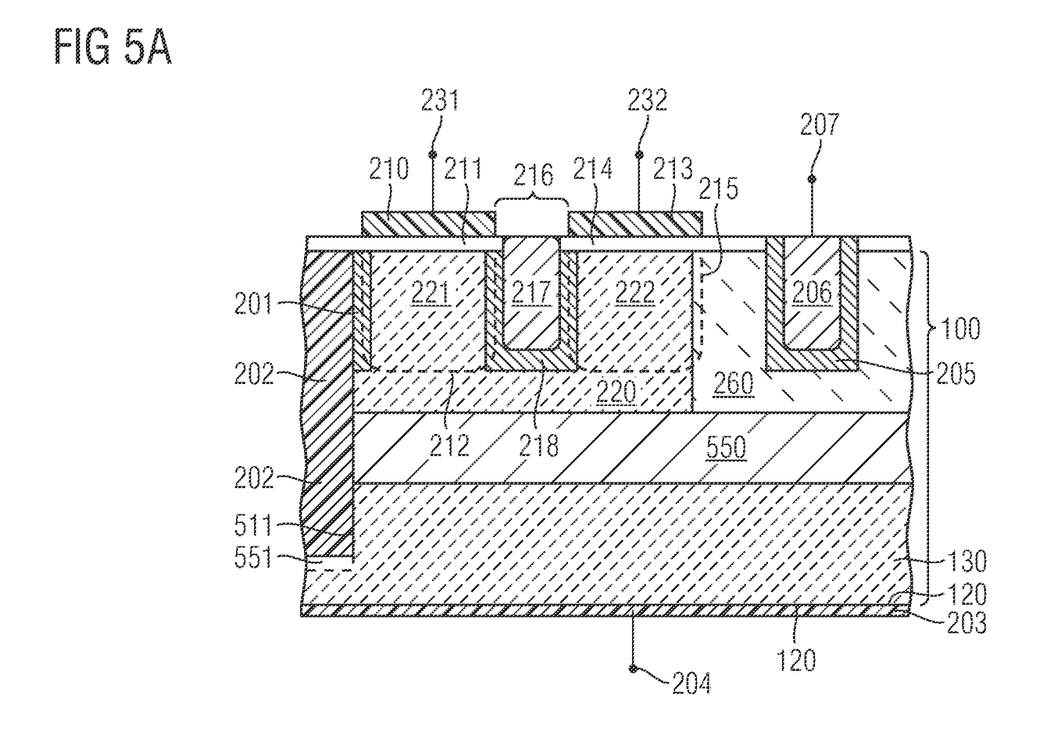
FIGS. 5A and 5B show cross-sectional views of a semiconductor device according to further embodiments.

FIG. 5A shows a vertical cross-sectional view of a semiconductor device according to a further embodiment. Differing from the embodiments discussed herein before, the source contact 202 largely extends into the semiconductor substrate 100. For example, the source contact 202 may be electrically connected via a substrate portion to a source conductive layer 203 that is disposed adjacent to a second main surface 120 of the semiconductor substrate. The components of the basic transistor structure are similar to the components of the transistors discussed herein before.

The semiconductor substrate 100 may comprise a base layer 130 e.g. of the second conductivity type and a second layer 550 which may be of a second conductivity type. The transistor comprises a body region 220 and a drift zone 260. The drift zone 260 may be of the first conductivity type, and the body region 220 may be of the second conductivity type. The source contact 202 may be arranged in a source contact groove 511 that extends approximately to the base layer 130. For example, a doped portion 551 may improve an electrical contact between the source contact 202 and the base layer 130. A source conductive layer 203 may be disposed adjacent to the second main surface 120 of the semiconductor substrate 100. For example, the source conductive layer 203 may be electrically connected to a source terminal 204. Accordingly, the source region 201 is electrically connected via the source contact 202 and a portion 130 of the semiconductor substrate to the source conductive layer 203. The source contact 202 may be disconnected from a main surface 110 of the semiconductor substrate.

The semiconductor device shown in FIG. 5A implements a vertical transistor comprising a terminal adjacent to the first main surface 110, e.g. the drain contact 206 and a contact to the second main surface 120, e.g. the source contact. The semiconductor device according to the embodiments of FIGS. 5A and 5B may comprise further components which have been explained above, e.g. a field plate. The connection portion 216 may be implemented in an arbitrary manner as has described hereinabove.

Figure 5B:
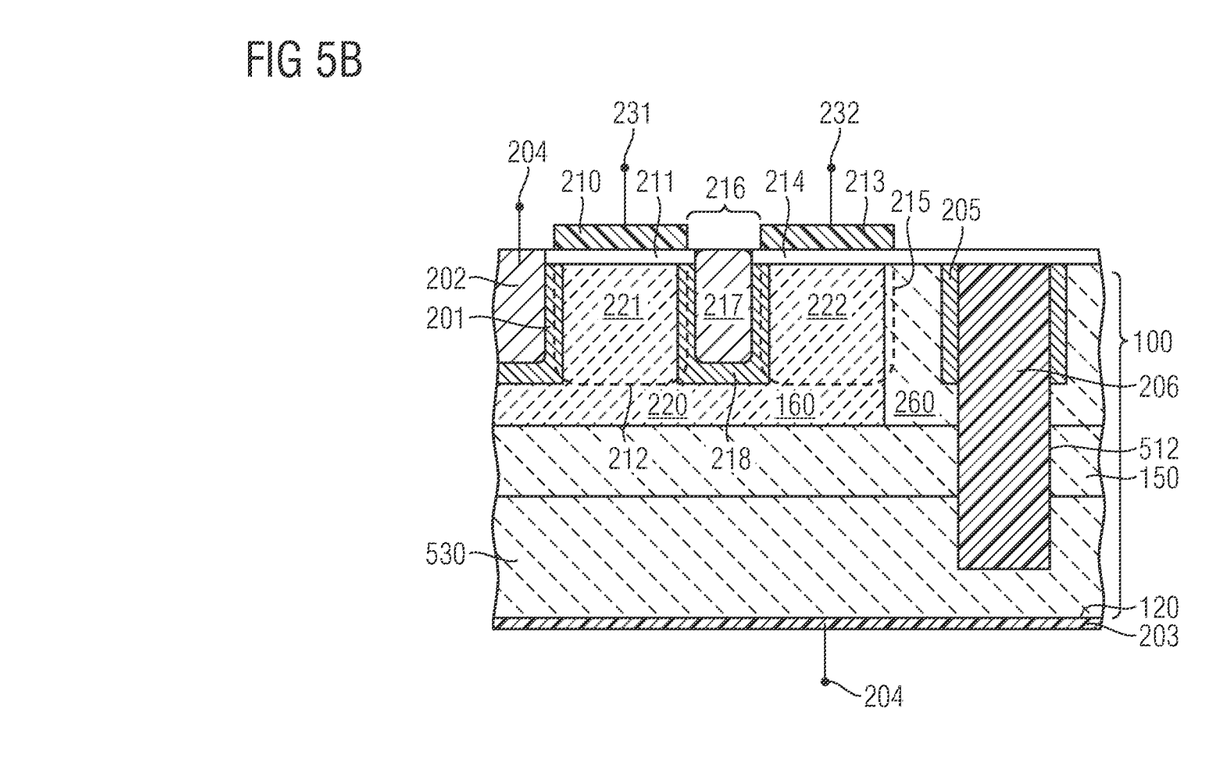

FIG. 5B shows a cross-sectional view of a semiconductor device in which the drain contact is electrically connected to a drain conductive layer 208 disposed at a second main surface 120 of the semiconductor substrate. The semiconductor device shown in FIG. 5B is formed in a semiconductor substrate 100 comprising a base layer 530 which may be of the first conductivity type. A second layer 150 of the first conductivity type may be disposed over the base layer 530. For example, a doping concentration of the base layer 530 may be higher that a doping concentration of the second layer 150. According to further embodiments, these layers may be merged and may have a gradient of the impurity concentration or may have the same impurity concentration. The drain contact 206 may be disposed in a drain contact groove 512 that extends to the base layer 530. For example, a portion of the base layer 530 may form part of the conductive path between the drain region 205 and the drain conductive layer 208 disposed at the second main surface 120 of the semiconductor substrate. The semiconductor device shown in FIG. 5B implements a vertical transistor in which the source region 201 is electrically connected via the source contact to a source terminal 204 disposed at a first main surface 110 of the semiconductor substrate. Further, the drain region 205 is electrically connected via the drain contact 206 and a portion of the base layer 530 to a drain conductive layer 208 at the second main surface 120 of the semiconductor substrate. The drain conductive layer 208 may be electrically connected to a drain terminal 207. A current of the device is mainly controlled along the first direction parallel to the main surface of the semiconductor substrate.

According to the embodiments shown in FIGS. 5A and 5B, a semiconductor device comprises a first gate electrode and a second gate electrode. The semiconductor device further comprises a first terminal at a first main surface of a semiconductor substrate and a second terminal at a second main surface. Hence, due to the specific arrangement discussed in FIGS. 5A and 5B in combination with the previous figures, it becomes feasible to implement a vertical semiconductor device comprising a first gate electrode and a second gate electrode.

While embodiments of the invention have been described above, it is obvious that further embodiments may be implemented. For example, further embodiments may comprise any sub combination of features recited in the claims or any sub combination of elements described in the examples given above. Accordingly, this spirit and scope of the appended claims should not be limited to the description of the embodiments contained herein.

What is claimed is:

1. A semiconductor device comprising a transistor, the transistor comprising:
   a source region and a drain region disposed adjacent to a first main surface of a semiconductor substrate;
   a first gate electrode and a second gate electrode, the first gate electrode being electrically disconnected from the second gate electrode;
   a body region, the first gate electrode being adjacent to a first portion of the body region and the second gate electrode being adjacent to a second portion of the body region, the first portion of the body region and the second portion of the body region forming integral parts of the body region;
   first trenches patterning the first portion of the body region into a first ridge; and
   second trenches the second portion of the body region into a second ridge,
   wherein the first gate electrode is arranged in at least one of the first trenches,
   wherein the second gate electrode is arranged in at least one of the second trenches.

2. The semiconductor device of claim 1, wherein the first trenches and the second trenches have a longitudinal axis parallel to the first main surface and extending along a line connecting the source region and the drain region.

3. The semiconductor device of claim 1, further comprising a connection portion configured to electrically connect the first portion of the body region with the second portion of the body region.

4. The semiconductor device of claim 3, wherein the connection portion comprises a doped substrate portion disposed in a connection groove.

5. The semiconductor device of claim 4, wherein the connection groove extends to a depth of the first or second trenches.

6. The semiconductor device of claim 1, further comprising a drift zone between the second portion of the body region and the drain region.

7. The semiconductor device of claim 1, further comprising a source contact extending to a second main surface of the semiconductor substrate.

8. The semiconductor device of claim 1, further comprising a drain contact extending to a second main surface of the semiconductor substrate.

9. The semiconductor device of claim 6, further comprising a field plate adjacent to the drift zone.

10. The semiconductor device of claim 9, wherein the field plate is disposed in field plate trenches that pattern the drift zone into a third ridge.

11. The semiconductor device of claim 10, wherein the field plate trenches extend to a deeper depth than the first and second trenches.

12. The semiconductor device of claim 9, wherein the field plate is disposed in at least one of the second trenches.

13. The semiconductor device of claim 9, wherein the field plate and the second gate electrode are electrically coupled to a second gate terminal.

14. The semiconductor device of claim 5, wherein the first gate trenches extend along a first gate length and the second gate trenches extend along a second gate length, the second gate length being larger than the first gate length.

15. The semiconductor device of claim 1, further comprising a vertical body contact portion electrically connected to a source contact and to the body region, the vertical body contact portion vertically overlapping with the source region.

16. The semiconductor device of claim 1, further comprising a source contact in a source contact groove in the first main surface, wherein the source region and a vertical body contact portion are alternatingly disposed at a sidewall of the source contact groove.

17. The semiconductor device of claim 1, further comprising a drain contact in a drain contact groove in the first main surface, wherein the drain groove is formed in the body region.

18. A semiconductor device comprising a transistor, the transistor comprising:
a source region and a drain region disposed adjacent to a first main surface of a semiconductor substrate;
a first gate electrode and a second gate electrode, the first gate electrode being electrically disconnected from the second gate electrode;
a body region, the first gate electrode being adjacent to a first portion of the body region and the second gate electrode being adjacent to a second portion of the body region;
first trenches patterning the first portion of the body region into a first ridge; and
second trenches the second portion of the body region into a second ridge,
wherein the first gate electrode is arranged in at least one of the first trenches,
wherein the second gate electrode is arranged in at least one of the second trenches,
the first trench and the second trench being arranged between the source region and the drain region, the transistor further comprising a connection portion adjacent to the first trench and to the second trench, the connection portion being configured to electrically connect the first portion of the body region with the second portion of the body region.

19. The semiconductor device of claim 18, further comprising a connection groove arranged adjacent to the first trench and to the second trench, the connection portion comprising a doped substrate portion in the connection groove.

20. A semiconductor device comprising a dual-gate transistor, the transistor comprising:
a source region and a drain region disposed adjacent to a first main surface of a semiconductor substrate;
a first gate electrode and a second gate electrode, the first gate electrode being electrically disconnected from the second gate electrode;
a body region, the first gate electrode being adjacent to a first portion of the body region and the second gate electrode being adjacent to a second portion of the body region;
first trenches patterning the first portion of the body region into a first ridge; and
second trenches the second portion of the body region into a second ridge,
wherein the first gate electrode is arranged in at least one of the first trenches,
wherein the second gate electrode is arranged in at least one of the second trenches.

* * * * *

UNITED STATES PATENT AND TRADEMARK OFFICE
CERTIFICATE OF CORRECTION

PATENT NO.           : 9,985,126 B2                                          Page 1 of 1
APPLICATION NO.      : 15/060790
DATED                : May 29, 2018
INVENTOR(S)          : A. Meiser It is certified that error appears in the above-identified patent and that said Letters Patent is hereby corrected as shown below:

On the Title Page

Abstract (Line 13), please change "of first" to -- of the first --.

Signed and Sealed this
Tenth Day of July, 2018

Andrei Iancu
*Director of the United States Patent and Trademark Office*